(12) United States Patent
Hashimoto

(10) Patent No.: US 7,332,371 B2
(45) Date of Patent: Feb. 19, 2008

(54) SEMICONDUCTOR DEVICE AND METHOD OF MANUFACTURE THEREOF, CIRCUIT BOARD AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 21 days.

(21) Appl. No.: 11/391,559

(22) Filed: Mar. 29, 2006

(65) Prior Publication Data

US 2006/0172460 A1 Aug. 3, 2006

Related U.S. Application Data

(60) Continuation of application No. 10/893,993, filed on Jul. 20, 2004, now abandoned, which is a division of application No. 10/190,515, filed on Jul. 9, 2002, now Pat. No. 6,972,381, which is a continuation of application No. 09/486,317, filed as application No. PCT/JP99/03420 on Jun. 25, 1999, now Pat. No. 6,462,284.

(30) Foreign Application Priority Data

Jul. 1, 1998 (JP) ............... 10-201246

(51) Int. Cl.
*H01L 21/00* (2006.01)
(52) U.S. Cl. ............... 438/108; 438/119; 257/E21.514
(58) Field of Classification Search ............... 438/108, 438/119; 257/E21.514
See application file for complete search history.

(56) References Cited

U.S. PATENT DOCUMENTS

| 4,811,081 A | 3/1989 | Lyden |
|---|---|---|
| 5,128,746 A | 7/1992 | Pennisi et al. |
| 5,136,365 A | 8/1992 | Pennisi et al. |
| 5,378,859 A | 1/1995 | Shirasaki et al. |
| 5,394,014 A | 2/1995 | Ishikawa et al. |
| 5,397,864 A | 3/1995 | Rai et al. |
| 5,473,119 A | 12/1995 | Rosenmayer et al. |
| 5,535,101 A | 7/1996 | Miles et al. |
| 5,578,527 A | 11/1996 | Chang et al. |
| 5,627,405 A | 5/1997 | Chillara |
| 5,814,401 A | 9/1998 | Gamota et al. |
| 5,895,971 A | 4/1999 | Nakanishi |
| 5,918,113 A | 6/1999 | Higashi et al. |
| 6,011,315 A | 1/2000 | Toyosawa et al. |
| 6,058,021 A | 5/2000 | Yamamoto |

(Continued)

FOREIGN PATENT DOCUMENTS

EP 0 824 270 A2 2/1998

(Continued)

*Primary Examiner*—Lex Malsawma
(74) *Attorney, Agent, or Firm*—Oliff & Berridge, PLC

(57) ABSTRACT

A method of manufacturing a semiconductor device comprises: a first step of interposing a thermosetting anisotropic conductive material 16 between a substrate 12 and a semiconductor chip 20; a second step in which pressure and heat are applied between the semiconductor chip 20 and the substrate 12, an interconnect pattern 10 and electrodes 22 are electrically connected, and the anisotropic conductive material 16 is spreading out beyond the semiconductor chip 20 and is cured in the region of contact with the semiconductor chip 20; and a third step in which the region of the anisotropic conductive material 16 other than the region of contact with the semiconductor chip 20 is heated.

16 Claims, 7 Drawing Sheets

U.S. PATENT DOCUMENTS

| | | |
|---|---|---|
| 6,061,248 A | 5/2000 | Otani et al. |
| 6,063,649 A | 5/2000 | Yoshino |
| 6,077,382 A | 6/2000 | Watanabe |
| 6,081,038 A | 6/2000 | Murayama |
| 6,157,085 A | 12/2000 | Terashima |
| 6,208,525 B1 | 3/2001 | Imasu et al. |
| 6,225,704 B1 | 5/2001 | Sumita et al. |
| 6,303,873 B1 * | 10/2001 | Mori et al. ................ 174/260 |
| 6,322,936 B1 | 11/2001 | Nishikawa et al. |
| 6,426,166 B2 | 7/2002 | Nishikawa et al. |

FOREIGN PATENT DOCUMENTS

| | | |
|---|---|---|
| JP | 356050546 A | 9/1979 |
| JP | 05-072402 | 3/1993 |
| JP | 07-049413 | 2/1995 |
| JP | A-07-312377 | 11/1995 |
| JP | A 10-4122 | 1/1998 |
| JP | A-10-004124 | 1/1998 |
| JP | A 10-4126 | 1/1998 |
| JP | A-10-004126 | 1/1998 |
| JP | A-10-084014 | 3/1998 |
| JP | A 10-84014 | 3/1998 |
| JP | 10-116855 | 5/1998 |
| JP | 10-125725 | 5/1998 |
| JP | A-10-116855 | 5/1998 |
| JP | A-10-125725 | 5/1998 |
| JP | A 10-135245 | 5/1998 |
| JP | 10-168411 A | 6/1998 |
| JP | A-11-67795 | 3/1999 |
| JP | 11-514944 | 12/1999 |
| JP | A-2000-021935 | 1/2000 |
| JP | A-2000-022329 | 1/2000 |
| WO | WO 96/42106 A1 | 12/1996 |
| WO | WO 98/10334 | 3/1998 |
| WO | WO 98/37444 | 8/1998 |

* cited by examiner

SEMICONDUCTOR DEVICE AND METHOD OF MANUFACTURE THEREOF, CIRCUIT BOARD AND ELECTRONIC INSTRUMENT

This application is a Continuation of application Ser. No. 10/893,993, filed Jul. 20, 2004, now abandoned which in turn is a Divisional of application Ser. No. 10/190,515, filed Jul. 9, 2002, now U.S. Pat. No. 6,972,381 B2, which in turn is a Continuation of application Ser. No. 09/486,317, filed Feb. 25, 2000, now U.S. Pat. No. 6,462,284 B1 which in turn is a National Stage of PCT/JP99/03420, filed Jun. 25, 1999, now U.S. Pat. No. 6,462,284 B1.

BACKGROUND

The present invention relates to a semiconductor device and method of manufacture thereof, and to a circuit board and an electronic instrument.

In recent years, with the increasing compactness of electronic instruments, semiconductor device packages adapted to high density mounting are in demand. In response to this, surface mounting packages such as a ball grid array (BGA) and a chip scale/size package (CSP) have been developed. In a surface mounting package, a substrate may be used which has formed thereon an interconnect pattern for connection to a semiconductor chip.

In a conventional surface mounting package, since there is a step of providing a protective film to protect the interconnect pattern and so forth, it is has been difficult to improve the productivity.

The present invention solves this problem, and has as its objective the provision of a method of manufacturing a semiconductor device and a semiconductor device manufactured by the method, of a circuit board and of an electronic instrument, having excellent reliability and productivity.

SUMMARY (1) A method of manufacturing a semiconductor device of the present invention comprises:

a first step of interposing an adhesive between a surface of a substrate on which an interconnect pattern is formed and a surface of a semiconductor chip on which electrodes are formed;

a second step of applying energy between the semiconductor chip and the substrate, electrically connecting the interconnect pattern and the electrodes, and making adhesive properties of the adhesive effective in the region of contact with the semiconductor chip while the adhesive spreading out beyond the semiconductor chip; and a third step of applying energy to the region of the adhesive other than the region of contact with the semiconductor chip.

(2) In this method of manufacturing a semiconductor device, the adhesive may be thermosetting;

the energy applied in the second step may be pressure and heat; and the energy applied in the third step may be heat.

The adhesive is cured in the region of contact with the semiconductor chip, and thereafter, the region other than the region of contact is heated and cured. Thus the adhesive is also cured in the region where it spreads out beyond the semiconductor chip. By means of this, the possibility of the adhesive coming apart from the substrate and allowing the ingress of water, leading to migration of the interconnect pattern can also be prevented. Since the adhesive is cured, the inclusion of water can be prevented.

(3) In this method of manufacturing a semiconductor device, the interconnect pattern and the electrodes may be electrically connected by conductive particles dispersed in the adhesive.

Since the interconnect pattern and electrodes are electrically connected by the conductive particles, a semiconductor device can be manufactured by a method of excellent reliability and productivity.

(4) In this method of manufacturing a semiconductor device, before the first step, the adhesive may be previously disposed on the surface of the semiconductor chip on which the electrodes are formed.

(5) In this method of manufacturing a semiconductor device, before the first step, the adhesive may be previously disposed on the surface of the substrate on which the interconnect pattern is formed.

(6) In this method of manufacturing a semiconductor device, in the third step, energy may be applied to a portion of the adhesive at which curing is not completed in the second step.

(7) In this method of manufacturing a semiconductor device, in the third step, the adhesive may be heated by a heating jig.

(8) In this method of manufacturing a semiconductor device, a nonadhesive layer having high nonadhesive properties to the adhesive may be interposed between the heating jig and the adhesive, and the adhesive is heated.

(9) In this method of manufacturing a semiconductor device, the heating jig may be provided with the nonadhesive layer.

(10) In this method of manufacturing a semiconductor device, the nonadhesive layer may be disposed on the adhesive.

(11) In this method of manufacturing a semiconductor device, in the third step, energy may be applied to the adhesive without contacting the adhesive.

(12) This method of manufacturing a semiconductor device may further comprise:

a reflow step in which solder balls connecting to the interconnect pattern are formed on the substrate, wherein the third step may be carried out in the reflow step.

(13) This method of manufacturing a semiconductor device may further comprise:

a reflow step in which in addition to the semiconductor chip, another electronic component is electrically connected to the interconnect pattern;

wherein the third step may be carried out in the reflow step.

(14) In this method of manufacturing a semiconductor device, after the third step, the substrate may be cut in a region other than a region in which the adhesive contacts with the semiconductor chip.

(15) In this method of manufacturing a semiconductor device, in the second step, the adhesive may be caused to surround at least a part of a lateral surface of the semiconductor chip.

Since the adhesive covers at least a part of the lateral surface of the semiconductor chip, not only is the semiconductor chip protected from mechanical damage, but also water can be prevented from reaching the electrodes, and corrosion can be prevented.

(16) In this method of manufacturing a semiconductor device, the adhesive may be provided before the first step at a thickness greater than the interval between the semiconductor chip and the substrate after the second step, and may spread out beyond the semiconductor chip by applying pressure between the semiconductor chip and the substrate in the second step.

(17) In this method of manufacturing a semiconductor device, the adhesive may include a shading material.

Since the adhesive includes a shading material, light can be prevented from reaching the surface of the semiconductor chip having the electrodes, and so malfunction of the semiconductor chip can be prevented.

(18) A method of manufacturing a semiconductor device according to the present invention comprises:

a first step of interposing an adhesive between a surface of a substrate on which an interconnect pattern is formed and a surface of a semiconductor chip on which electrodes are formed;

a second step of electrically connecting the interconnect pattern and the electrodes, and curing the adhesive at least in a position between the semiconductor chip and the substrate while the adhesive spreading out beyond the semiconductor chip; and a third step of cutting the substrate in a region in which the adhesive spreads out beyond the semiconductor chip.

According to the present invention, the adhesive is cut after it is provided spreading out beyond the semiconductor chip. Thus, there is no requirement for accurate positioning with respect to the semiconductor chip at the same size as the semiconductor chip. Since the adhesive is cut in the region spreading out beyond the semiconductor chip together with the substrate, the entire surface of the substrate is covered by the adhesive so that migration and the like of the interconnect pattern can be prevented.

(19) In this method of manufacturing a semiconductor device, the adhesive may be a thermosetting adhesive, and heat may be applied to the adhesive in the second step.

(20) In this method of manufacturing a semiconductor device, the adhesive may be a thermoplastic adhesive, and the adhesive may be cooled in the second step.

(21) In this method of manufacturing a semiconductor device, the interconnect pattern and the electrodes may be electrically connected by conductive particles dispersed in the adhesive.

(22) In this method of manufacturing a semiconductor device, before the first step, the adhesive may be previously disposed on the surface of the semiconductor chip on which the electrodes are formed.

(23) In this method of manufacturing a semiconductor device, before the first step, the adhesive may be previously disposed on the surface of the substrate on which the interconnect pattern is formed.

(24) In this method of manufacturing a semiconductor device, in the third step, a cutting position may be in a region outside an end of the interconnect pattern of the substrate.

(25) In this method of manufacturing a semiconductor device, in the second step, the whole of the adhesive may be cured; and in the third step, the cured adhesive may be cut.

Since the cured adhesive is cut, the cutting can be carried out easily.

(26) In this method of manufacturing a semiconductor device, in the second step, the adhesive may be caused to surround at least a part of a lateral surface of the semiconductor chip.

Since the adhesive covers at least a part of the lateral surface of the semiconductor chip, not only is the semiconductor chip protected from mechanical damage, but also water can be prevented from reaching the electrodes, and corrosion can be prevented.

(27) In this method of manufacturing a semiconductor device, the adhesive may be provided before the first step at a thickness greater than the interval between the semiconductor chip and the substrate after the second step, and may spread out beyond the semiconductor chip by applying pressure between the semiconductor chip and the substrate in the second step.

(28) In this method of manufacturing a semiconductor device, the adhesive may include a shading material.

Since the adhesive includes a shading material, light can be prevented from reaching the surface of the semiconductor chip having the electrodes, and so malfunction of the semiconductor chip can be prevented.

(29) A semiconductor device according to the present invention comprises:

a semiconductor chip having electrodes; a substrate having an interconnect pattern; and a thermosetting adhesive;

wherein the electrodes and the interconnect pattern are electrically connected; and wherein the adhesive is interposed between a surface of the substrate on which the interconnect pattern is formed and a surface of the semiconductor chip on which the electrodes are formed, and spreads out beyond the semiconductor chip, and the whole of the adhesive is cured.

According to the present invention, the adhesive is also cured in a region outside that of contact with the semiconductor chip. Thus, the possibility of the adhesive coming apart from the substrate and allowing the ingress of water, leading to migration of the interconnect pattern can be prevented. Also, since all of the adhesive is cured, the inclusion of water can be prevented.

(30) In this semiconductor device, conductive particles may be dispersed in the adhesive to form an anisotropic conductive material.

Since the interconnect pattern and electrodes are electrically connected by the anisotropic conductive material, the reliability and productivity are excellent.

(31) In this semiconductor device, the anisotropic conductive material may be provided to cover the whole of the interconnect pattern.

(32) In this semiconductor device, the adhesive may cover at least a part of a lateral surface of the semiconductor chip.

Since the adhesive covers at least a part of the lateral surface of the semiconductor chip, the semiconductor chip is protected from mechanical damage. Additionally, since the semiconductor chip is covered by the adhesive as far as a position remote from the electrodes, water can be prevented from reaching the electrodes, and corrosion can be prevented.

(33) In this semiconductor device, the adhesive may include a shading material.

Since the adhesive includes a shading material, light can be prevented from reaching the surface of the semiconductor chip having the electrodes, and so malfunction of the semiconductor chip can be prevented.

(34) A semiconductor device according to the present invention is manufactured by the above-described method.

(35) On a circuit board according to the present invention, the above-described semiconductor device is mounted.

(36) An electronic instrument according to the present invention has the above-described circuit board.

DETAILED DESCRIPTION OF EMBODIMENTS

A preferred embodiment of the present invention will be described, with reference to the drawings.

First Embodiment

Figure 1A:
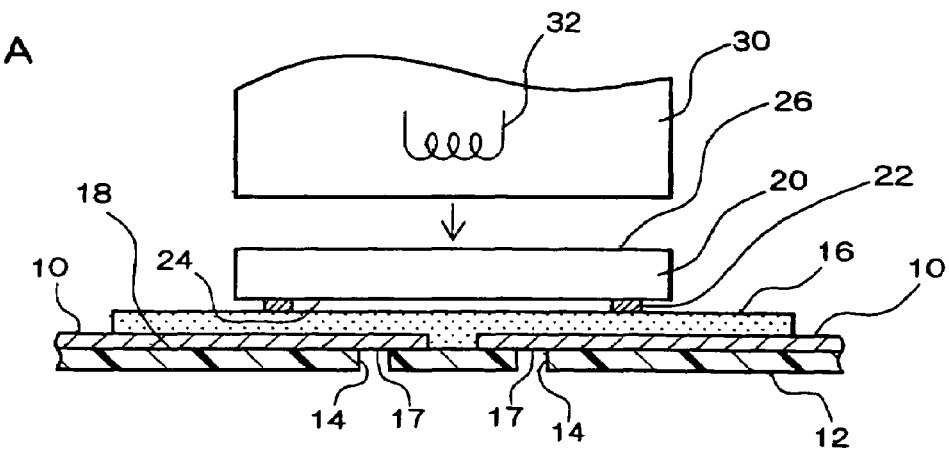
FIGS. 1A to 1D show a method of manufacturing a semiconductor device in accordance with a first embodiment relating to the present invention.

A method of manufacturing a semiconductor device in accordance with the first embodiment is shown in FIGS. 1A to 1D. In this embodiment, a substrate 12 is used which has an interconnect pattern 10 formed on at least one surface 18, as shown in FIG. 1A.

The substrate 12 may be a flexible substrate formed of an organic material, a metal substrate formed of an inorganic material, or a combination of these. As a flexible substrate may be used a tape carrier. If the electric conductivity of the substrate 12 is high, an insulating film is formed between the substrate 12 and the interconnect pattern 10 and on inner surfaces of through holes 14. In addition, the insulating film may also be formed on a surface of the substrate opposite to the surface on which the interconnect pattern 10 is formed.

The through holes 14 are formed in the substrate 12, and the interconnect pattern 10 is formed on the substrate, covering the through holes 14. Lands 17 for external electrodes are formed over the through holes 14, as part of the interconnect pattern 10.

An anisotropic conductive material 16, as one example of an adhesive, is provided on a thus obtained substrate 12. In the description that follows, an anisotropic conductive material is given as an example of an adhesive. The anisotropic conductive material 16 comprises an adhesive (binder) in which are dispersed conductive particles (conductive filler), and in some cases a dispersant is added. The anisotropic conductive material 16 could be previously formed as a sheet that is affixed to the substrate 12, or it could equally well be provided as a liquid on the substrate 12. The anisotropic conductive material 16 may be provided to be larger than a surface 24 of a semiconductor chip 20 on which electrodes 22 are provided, or may be provided in a quantity to be smaller than the surface 24, then compressed so as to spread out beyond the surface 24.

Alternatively, the anisotropic conductive material 16 may be provided on the surface 24 of the semiconductor chip 20, in a quantity to be compressed so as to spread out beyond the surface 24. It should be noted that even if an adhesive not including conductive particles is used, the electrodes 22 and interconnect pattern 10 can be electrically connected.

In this embodiment, a thermosetting adhesive is used as the anisotropic conductive material, and the anisotropic conductive material 16 may further include a shading material. As a shading material can be used, for example, a black dye or black pigment dispersed in an adhesive resin.

As the adhesive may be used a thermosetting adhesive as typified by an epoxy type, or a photocurable adhesive as typified by an epoxy or acrylate type. Further, the type of adhesive cured by electron beam, or a thermoplastic (thermal adhesion) type of adhesive may equally be used. In the following description, if an adhesive other than thermosetting is used, the provision of energy should be substituted in place of the application of heat or pressure.

Next, the semiconductor chip 20 is mounted on the anisotropic conductive material 16, for example. In more detail, the semiconductor chip 20 is mounted such that the surface 24 of the semiconductor chip 20 on which the electrodes 22 are formed faces the anisotropic conductive material 16. Moreover, the semiconductor chip 20 is disposed so that the each electrode 22 is positioned over a land (not shown in the figures) for connection of the electrodes to the interconnect pattern 10. It should be noted that the semiconductor chip 20 may have the electrodes 22 formed on two edges only, or may have the electrodes 22 formed on four edges. The electrodes 22 are commonly in the form of projections made of gold, solder or the like provided on aluminum pads. The electrodes 22 may be formed on the interconnect pattern 10 side in the form of such projections or projections formed by etching the interconnect pattern 10.

By means of the above process, the anisotropic conductive material 16 is positioned between the surface 24 of the semiconductor chip 20 on which the electrodes 22 are formed and the surface 18 of the substrate 12 on which the interconnect pattern 10 is formed. A jig 30 is then used to press a surface 26 of the semiconductor chip 20 which is opposite to the surface 24 on which the electrodes 22 are formed such that the semiconductor chip 20 is subjected to pressure in the direction of the substrate 12. Alternatively, pressure may be applied between the semiconductor chip 20 and the substrate 12. Even if the anisotropic conductive material 16 as an adhesive is provided within the area of the surface 24 of the semiconductor chip 20, the applied pressure causes it to spread out beyond the surface 24. The jig 30 has an internal heater 32, and applies heat to the semiconductor chip 20. It should be noted that considering the requirement as far as possible to apply heat also to the spread out portion of the anisotropic conductive material 16, the jig 30 used preferably has a greater plan area than the plan area of the semiconductor chip 20. In this way, heat can easily be applied to the periphery of the semiconductor chip 20.

Figure 1B:
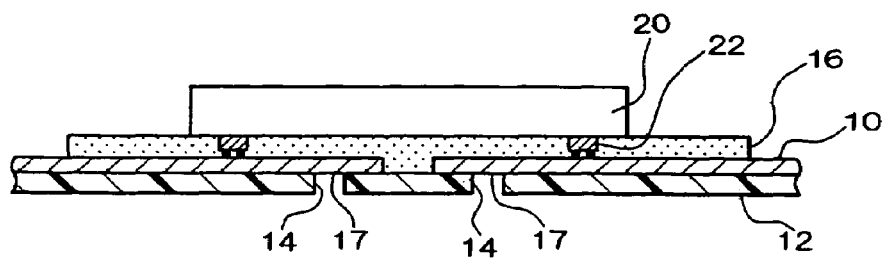

Thus, as shown in FIG. 1B, the electrodes 22 of the semiconductor chip 20 and the interconnect pattern 10 are electrically connected through the conductive particles of the anisotropic conductive material 16. According to this embodiment, since the interconnect pattern 10 and electrodes 22 are electrically connected through the anisotropic conductive material 16, a semiconductor device can be manufactured by a method of excellent reliability and productivity.

Since heat is applied to the semiconductor chip 20 by the jig 30, the anisotropic conductive material 16 is cured in the region of contact with the semiconductor chip 20. In the region not contacting the semiconductor chip 20 or the region apart from the semiconductor chip 20, heat does not reach the anisotropic conductive material 16, so that the curing is incomplete. The curing of these regions is carried out in the following step.

Figure 1C:
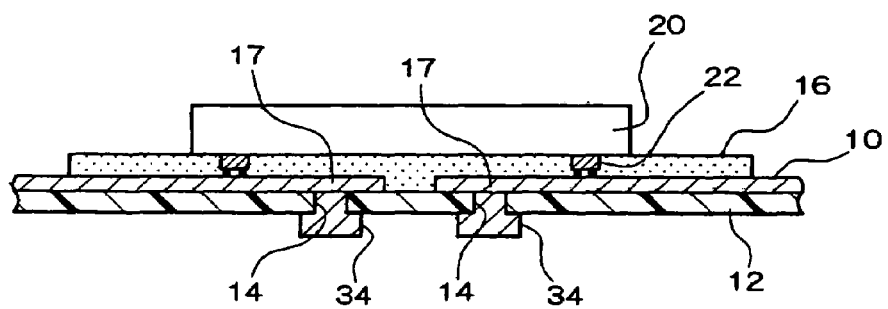

As shown in FIG. 1C, solder 34 is provided within and around the periphery of the through holes 14 in the substrate 12. A cream solder or the like may be used to form the solder 34 by printing. Alternatively, pre-formed solder balls may be mounted in the above-described position.

Figure 1D:
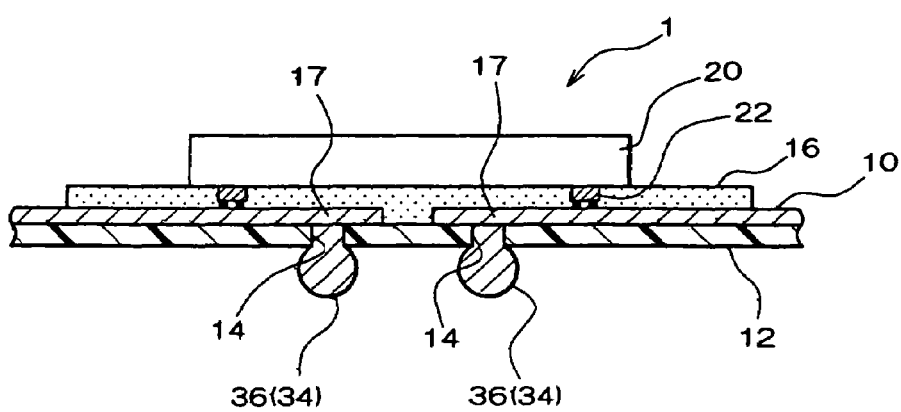

The solder 34 is then heated in a reflow step, and solder balls 36 are formed as shown in FIG. 1D. The solder balls 36 function as external electrodes. In this reflow step, not only the solder 34 but also the anisotropic conductive material 16 is heated. This heat cures the regions of the anisotropic conductive material 16 which are not yet cured. That is to say, of the anisotropic conductive material 16, the region not contacting the semiconductor chip 20 or the region apart from the semiconductor chip 20, is cured in the reflow step of forming the solder balls 36.

In the thus obtained semiconductor device 1, since the whole of the anisotropic conductive material 16 is cured, the possibility of the anisotropic conductive material 16 around the semiconductor chip 20 coming apart from the substrate 12 and allowing the ingress of water, leading to migration of the interconnect pattern 10 is prevented. Since the whole of the anisotropic conductive material 16 is cured, the inclusion of water within the anisotropic conductive material 16 can also be prevented.

Further in the semiconductor device 1, since the electrodes 22 provided on the surface 24 of the semiconductor chip 20 are covered by the anisotropic conductive material 16 which includes a shading material, light can be prevented from reaching this surface 24. Therefore, malfunction of the semiconductor chip 20 can be prevented.

Figure 2A:
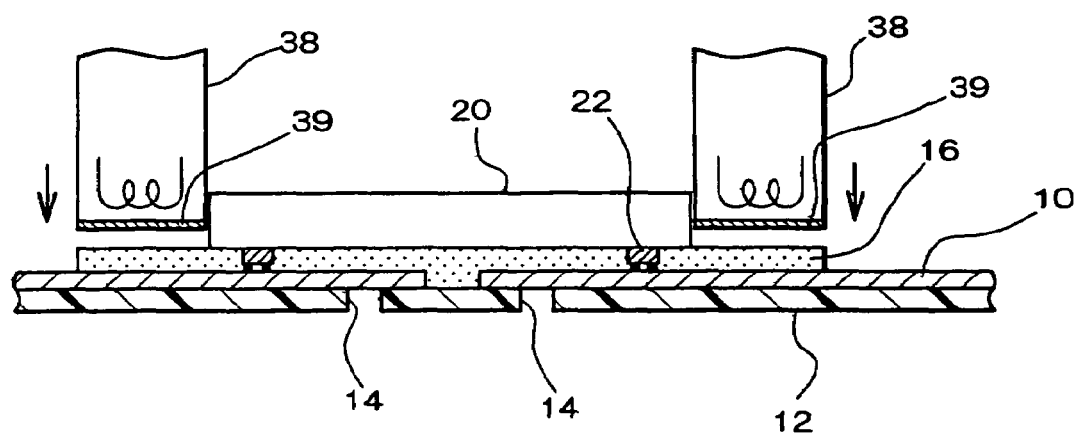
FIGS. 2A and 2B show a modification of the first embodiment.
Figure 2B:
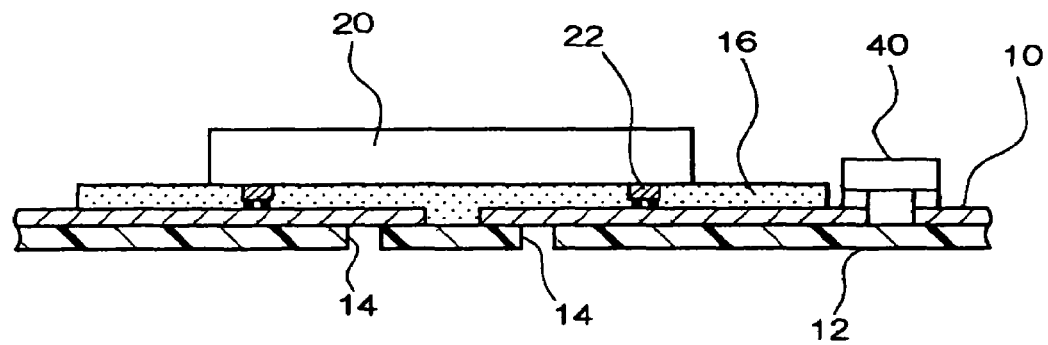

FIGS. 2A and 2B show a modification of the first embodiment. In these modifications, the structure which is the same as in the first embodiment is indicated by the same reference numerals, and description of this structure and the effect of this structure is omitted. The same is true for the following embodiments.

The step shown in FIG. 2A can be carried out after the step of FIG. 1B and before the step of FIG. 1C. In more detail, of the anisotropic conductive material 16, the region not contacting the semiconductor chip 20 and the region apart from the semiconductor chip 20, are heated by a heating jig 38. The heating jig 38 is preferably provided with a nonadhesive layer 39 formed of Teflon or the like having high nonadhesive properties to the anisotropic conductive material 16 that is an example of an adhesive, so that uncured anisotropic conductive material 16 does not adhere thereto. Alternatively, the nonadhesive layer 39 may be provided on the anisotropic conductive material 16 that is an example of an adhesive. Further, the anisotropic conductive material 16 as an example of an adhesive may be heated by a non-contact method. By this means, of the anisotropic conductive material 16, the region not contacting the semiconductor chip 20 and the region apart from the semiconductor chip 20 can be cured. In place of a jig, a hot air blower or optical heater capable of localized heating may be used.

Alternatively, as shown in FIG. 2B, after the step of FIG. 1B and before the step of FIG. 1C, a reflow step may be carried out to electrically connect an electronic component 40 distinct from the semiconductor chip 20 to the interconnect pattern 10. By means of this reflow step, of the anisotropic conductive material 16, the region not contacting the semiconductor chip 20 and the region apart from the semiconductor chip 20 is heated and cured. It should be noted that as the electronic component 40 may be cited for example a resistor, capacitor, coil, oscillator, filter, temperature sensor, thermistor, varistor, variable resistor, or a fuse.

According to these modifications also, all of the anisotropic conductive material 16 can be cured, and the possibility of the anisotropic conductive material 16 coming apart from the substrate 12 and allowing the ingress of water, leading to migration of the interconnect pattern 10 can be prevented. Since the whole of the anisotropic conductive material 16 is cured, the inclusion of water can also be prevented.

After the above described steps, the substrate 12 may be cut in the region in which the anisotropic conductive material 16 being an example of an adhesive spreads beyond the semiconductor chip 20.

This embodiment has been described with a substrate with interconnects on one surface only as the substrate 12, but is not limited to this, and a double-sided interconnect substrate or multi-layer interconnect may be used. In this case, instead of disposing solder in the through holes, solder balls may be formed on lands provided on the surface opposite to that on which the semiconductor chip is mounted. In place of solder balls other conductive projections may be used. The connection between the semiconductor chip and the substrate may be carried out by wire bonding. These observations apply equally to the following embodiments.

In this embodiment, not only a thermosetting adhesive, but also an anisotropic conductive material 16 being an example of a thermoplastic adhesive may be used. A thermoplastic adhesive can be hardened by cooling. Alternatively, an adhesive which can be hardened by radiation such as ultraviolet light may be used. This applies equally to the following embodiments.

Second Embodiment

Figure 3A:
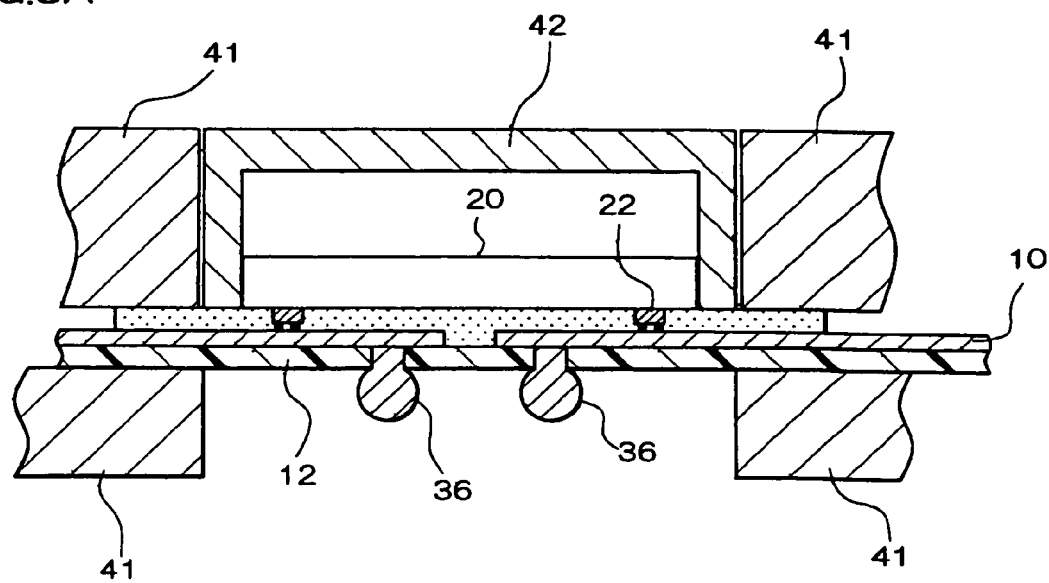
FIGS. 3A and 3B show a method of manufacturing a semiconductor device in accordance with a second embodiment relating to the present invention.
Figure 3B:
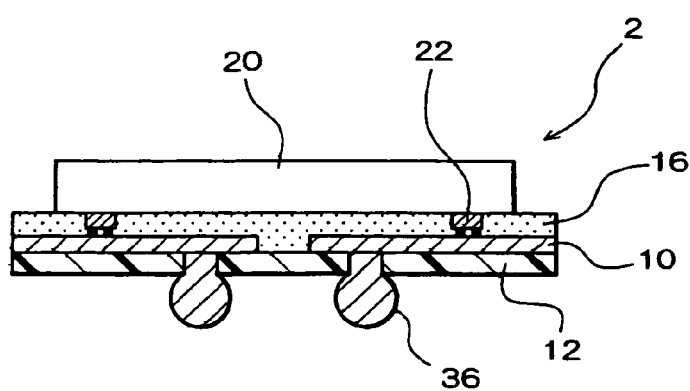

A method of manufacturing the semiconductor device in accordance with the second embodiment is shown in FIG. 3A and 3B. This embodiment is carried out following on from the first embodiment.

More specifically, in this embodiment, following on from the step of FIG. 1D, the anisotropic conductive material 16 and substrate 12 are held by a fixed blade 41, and cut by a movable blade 42 to a size slightly larger than the semiconductor chip 20, as shown in FIG. 3A, yielding a semiconductor device 2 shown in FIG. 3B. The cutting means is not limited thereto, and any other available cutting means and holding means can be applied. Since the substrate 12 is cut together with the anisotropic conductive material 16, the cut through the two is coplanar, and the entire surface of the substrate 12 is covered by the anisotropic conductive material 16. Therefore, the interconnect pattern 10 is not exposed, and moisture is prevented from reaching the interconnect pattern 10 and causing migration.

According to this embodiment, since the anisotropic conductive material 16 is cut, it does not require to be previously cut to the same size as the semiconductor chip 20 or slightly larger, and accurate positioning with respect to the semiconductor chip 20 is not required.

It should be noted that this embodiment is an example of the anisotropic conductive material 16 and substrate 12 being cut after the solder balls 36 are formed, but the timing of the cut is independent of the formation of the solder balls 36, as long as it is at least after the semiconductor chip 20 has been mounted on the anisotropic conductive material 16. However, the anisotropic conductive material 16 is preferably cured at least in the region of contact with the semiconductor chip 20. In this case, mispositioning of the semiconductor chip 20 and interconnect pattern 10 can be prevented. If the anisotropic conductive material 16 is cured rather than uncured in the location of the cut, the cutting operation will be easier.

It should be noted that when the substrate 12 is cut, the whole of the anisotropic conductive material 16 being an example of an adhesive may be cured in a single operation. For example, when the electrodes 22 of the semiconductor chip 20 and the interconnect pattern 10 are electrically connected, to the whole of the anisotropic conductive material 16 being an example of an adhesive heat may be applied or cooling applied. When a thermosetting adhesive is used, a jig may be used which contacts both of the semiconductor chip 20 and the adhesive spreading out beyond the semiconductor chip 20. Alternatively, heating may be applied by means of an oven.

Third Embodiment

Figure 4A:
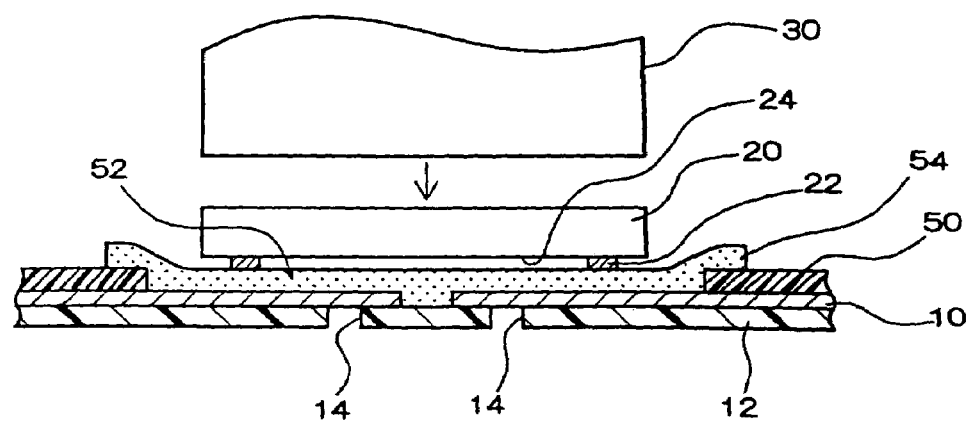
FIGS. 4A and 4B show a method of manufacturing a semiconductor device in accordance with a third embodiment relating to the present invention.
Figure 4B:
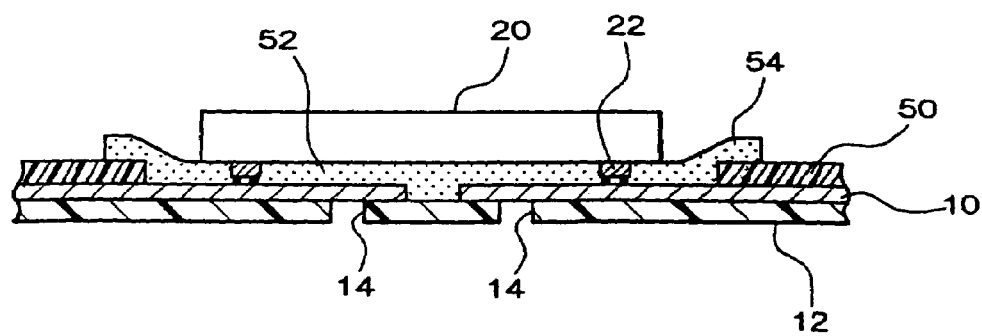

A method of manufacturing a semiconductor device in accordance with the third embodiment is shown in FIGS. 4A and 4B show. In this embodiment, the substrate 12 of the first embodiment is used, and on the substrate 12 is formed a protective layer 50. The protective layer 50 is such as to cover the interconnect pattern 10, preventing contact with water, and for example solder resist may be used.

The protective layer 50 is formed around a region 52 that is larger in extent than the region in which the semiconductor chip 20 is mounted on the substrate 12. That is to say, the region 52 is larger than the surface 24 of the semiconductor chip 20 having the electrodes 22, and within this region 52 the lands (not shown in the drawings) for connection to the electrodes 22 of the semiconductor chip 20 are formed on the interconnect pattern 10. Alternatively, the protective layer 50 may be formed to avoid at least portions for electrical connection to the electrode 20 of the semiconductor chip 20.

On such a substrate 12 an anisotropic conductive material 54 (adhesive) of a material which can be selected as the anisotropic conductive material 16 of the first embodiment is provided. It should be noted that the anisotropic conductive material 54 does not necessarily contain a shading material, but if it does contain a shading material then the same effect as in the first embodiment is obtained.

In this embodiment, the anisotropic conductive material 54 is provided from the region of mounting of the semiconductor chip 20 to the protective layer 50. That is to say, the anisotropic conductive material 54 covers the interconnect pattern 10 and substrate 12 in the region 52 in which the protective layer 50 is not formed, and is also formed to overlap the edge of the protective layer 50 surrounding the region 52. Alternatively, the anisotropic conductive material 54 being an example of an adhesive may be provided on the semiconductor chip 20 side. In more detail, the description in the first embodiment applies.

The semiconductor chip 20 is then pressed toward the substrate 12 and heat is applied by the jig 30, as shown in FIG. 4A. Alternatively, pressure is applied at least between the semiconductor chip 20 and the substrate 12. In this way, the electrodes 22 of the semiconductor chip 20 and the interconnect pattern 10 are electrically connected, as shown in FIG. 4B. Thereafter, in the same way as in the steps shown in FIGS. 1C and 1D, solder balls are formed, and the semiconductor device is obtained.

According to this embodiment, the anisotropic conductive material 54 is not only formed in the region 52 in which the protective layer 50 is not formed, but also formed to overlap the edge of the protective layer 50 surrounding the region 52. Consequently, there is no gap between the anisotropic conductive material 54 and the protective layer 50, and the interconnect pattern 10 is not exposed, so that migration can be prevented.

It should be noted that in this embodiment, it is preferable that the anisotropic conductive material 54 is cured also in the region spreading beyond the semiconductor chip 20. This curing step can be carried out in the same way as in the first embodiment.

Fourth Embodiment

Figure 5A:
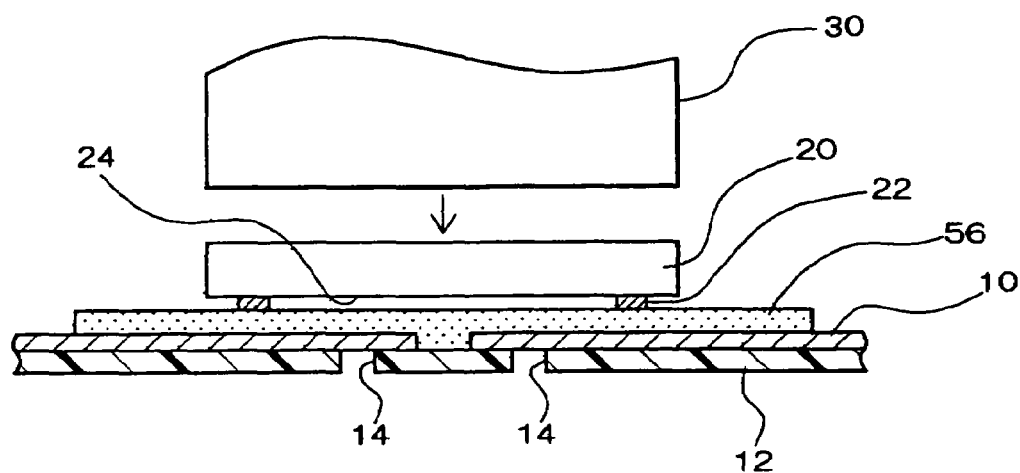
FIGS. 5A and 5B show a method of manufacturing a semiconductor device in accordance with a fourth embodiment of the present invention.
Figure 5B:
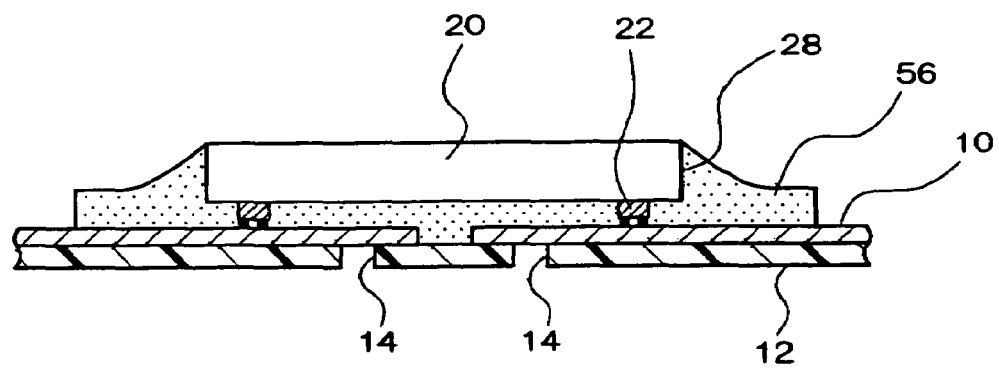

A method of manufacturing a semiconductor device in accordance with a fourth embodiment of the present invention is shown in FIGS. 5A and 5B. In this embodiment, the substrate 12 of the first embodiment is used, and an anisotropic conductive material 56 (adhesive) is provided on the substrate 12. The difference between this embodiment and the first embodiment is in the thickness of the anisotropic conductive material 56. That is to say, as shown in FIG. 5A, in this embodiment the thickness of the anisotropic conductive material 56 is greater than the thickness of the anisotropic conductive material 16 shown in FIG. 1A. More specifically, the anisotropic conductive material 56 is thicker than the interval between the surface 24 of the semiconductor chip 20 having the electrodes 22 and the interconnect pattern 10 formed on the substrate 12. The anisotropic conductive material 56 is at least slightly larger than the semiconductor chip 20. It should be noted that it is sufficient for either of these thickness and size conditions to be satisfied.

As shown in FIG. 5A, the semiconductor chip 20 is then pressed toward the substrate 12 and heat is applied by the jig 30, for example. By doing this, the anisotropic conductive material 56 surrounds a part or all of a lateral surface 28 of the semiconductor chip 20, as shown in FIG. 5B. Thereafter, solder balls are formed in the same way as in the steps shown in FIGS. 1C and 1D, and the semiconductor device is obtained.

According to this embodiment, since at least part of the lateral surface 28 of the semiconductor chip 20 are covered by the anisotropic conductive material 56, the semiconductor chip 20 is protected from mechanical damage. Moreover, since the anisotropic conductive material 56 covers as far as a position removed from the electrodes 22, corrosion of the electrodes 22 and so on can be prevented.

Although the above embodiment has been described principally in terms of a chip size/scale package (CSP) of face-down bonding (FDB), the present invention can be applied to any semiconductor device to which FDB is applied, such as a semiconductor device to which Chip on Film (COF) or Chip on Board (COB) is applied, or the like.

Figure 6:
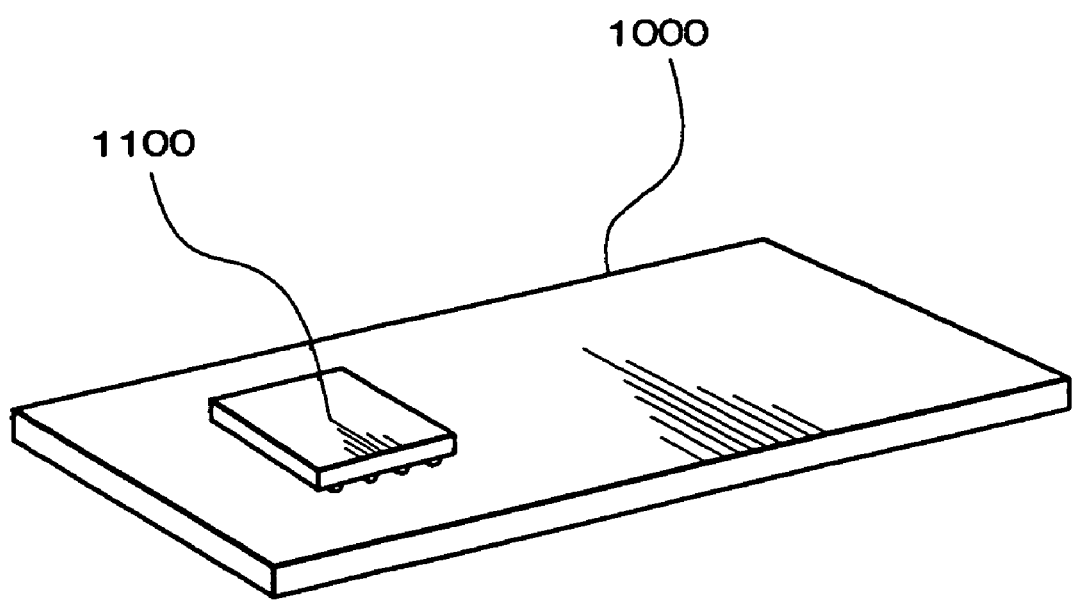
FIG. 6 shows a circuit board on which is mounted a semiconductor device in accordance with the embodiment of the present invention.

A circuit board 1000 on which is mounted a semiconductor device 1100 fabricated by the method of the above described embodiment is shown in FIG. 6. An organic substrate such as a glass epoxy substrate or the like is generally used for the circuit board 1000. On the circuit board 1000, an interconnect pattern of for example copper is formed to provide a desired circuit. Then electrical connection is achieved by mechanical connection of the interconnect pattern and external electrodes of the semiconductor device 1100.

It should be noted that the semiconductor device 100 has a mounting area which can be made as small as the area for mounting a bare chip, and therefore when this circuit board 1000 is used in an electronic instrument, the electronic instrument itself can be made more compact. Moreover, a larger mounting space can be obtained within the same area, and therefore higher functionality is possible.

Figure 7:
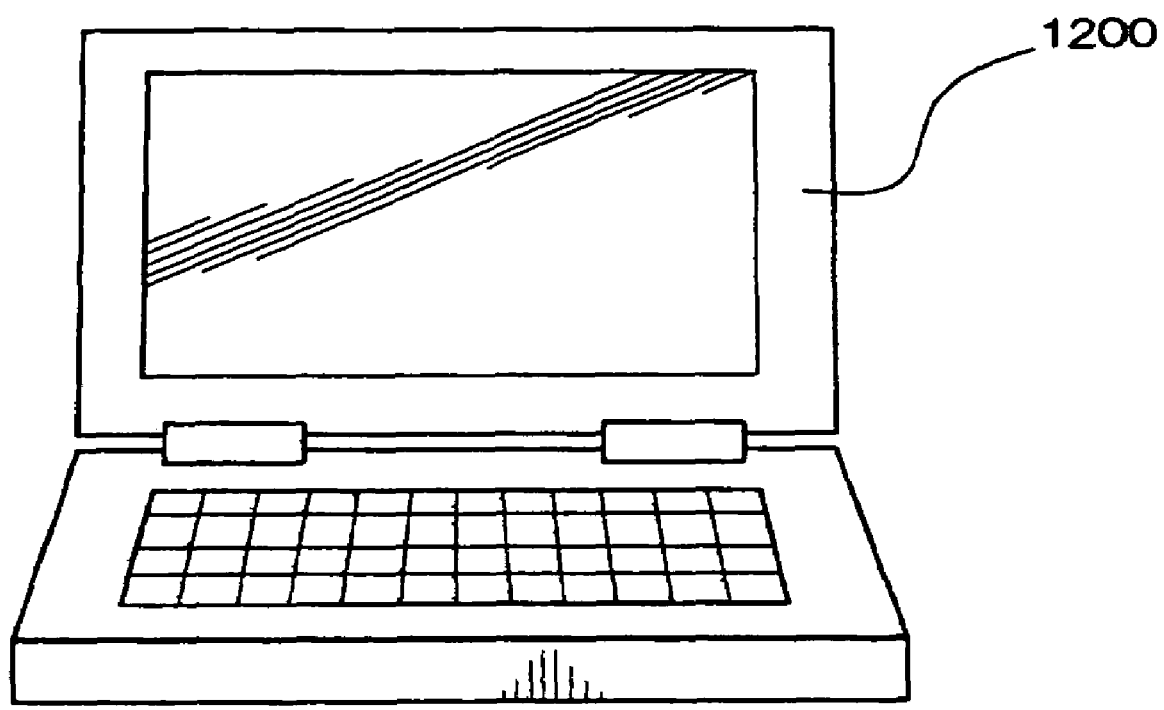
FIG. 7 shows an electronic instrument having a circuit board on which is mounted a semiconductor device in accordance with the embodiment of the present invention.

Then as an example of an electronic instrument equipped with this circuit board 1000, a notebook personal computer 1200 is shown in FIG. 7.

It should be noted that, whether active components or passive components, the present invention can be applied to various surface-mounted electronic components. As electronic components, for example, may be cited resistors, capacitors, coils, oscillators, filters, temperature sensors, thermistors, varistors, variable resistors, and fuses.

What is claimed is:

1. A method of manufacturing a semiconductor device, the semiconductor device including a semiconductor chip having electrodes formed thereon; and a substrate having an interconnect pattern formed thereon and a protective layer on a part of the interconnect pattern, the substrate having a first region on which the semiconductor chip is mounted and a second region located outside the first region, a part of the interconnect pattern in the second region exposed from the protective layer, the method comprising:
    (a) disposing an adhesive including a first part located in the first region and a second part located in the second region such that the part of the interconnect pattern exposed from the protective layer in the second region is entirely covered with the adhesive, and electrically connecting the electrodes to the interconnect pattern; and
    (b) applying energy to the adhesive and hardening the adhesive.

2. The method of manufacturing a semiconductor device as defined in claim 1, wherein the adhesive is thermosetting and the energy applied in the step (b) is heat.

3. The method of manufacturing a semiconductor device as defined in claim 2, wherein in the step (b), the adhesive is heated by a heating jig.

4. The method of manufacturing a semiconductor device as defined in claim 3, wherein a nonadhesive layer having high nonadhesive properties to the adhesive is interposed between the heating jig and the adhesive, and the adhesive is heated.

5. The method of manufacturing a semiconductor device as defined in claim 4, wherein the heating jig is provided with the nonadhesive layer.

6. The method of manufacturing a semiconductor device as defined in claim 4, wherein the nonadhesive layer is disposed on the adhesive.

7. The method of manufacturing a semiconductor device as defined in claim 2, further comprising a reflow step in which solder balls connecting to the interconnect pattern are formed on the substrate, wherein the step (b) is carried out in the reflow step.

8. The method of manufacturing a semiconductor device as defined in claim 2, further comprising a reflow step in which in addition to the semiconductor chip, another electronic component is electrically connected to the interconnect pattern, wherein the step (b) is carried out in the reflow step.

9. The method of manufacturing a semiconductor device as defined in claim 1, wherein the interconnect pattern and the electrodes are electrically connected by conductive particles dispersed in the adhesive.

10. The method of manufacturing a semiconductor device as defined in claim 1, wherein in the step (a), the adhesive is disposed on the surface of the semiconductor chip on which the electrodes are formed.

11. The method of manufacturing a semiconductor device as defined in claim 1, wherein in the step (a), the adhesive is disposed on the surface of the substrate on which the interconnect pattern is formed.

12. The method of manufacturing a semiconductor device as defined in claim 1, wherein in the step (b), the energy is applied to the adhesive without contacting the adhesive.

13. The method of manufacturing a semiconductor device as defined in claim 1, wherein after the step (b), the substrate is cut in a region other than a region in which the adhesive contacts with the semiconductor chip.

14. The method of manufacturing a semiconductor device as defined in claim 1, wherein after the step (b), the adhesive is caused to surround at least a part of a lateral surface of the semiconductor chip.

15. The method of manufacturing a semiconductor device as defined in claim 1, wherein the adhesive includes a shading material.

16. A method of manufacturing a semiconductor device, the semiconductor device including a semiconductor chip having an electrode formed thereon;

and a substrate having a first region on which the semiconductor chip is mounted and a second region located outside the first region, the substrate having an interconnect pattern formed thereon and a protective layer having an opening overlapping with the first region and a part of the second region, the protective layer being formed on a first part of the interconnect pattern, a second part of the interconnect pattern being located in the opening, the method comprising:

(a) disposing an adhesive including a first portion located in the first region and a second portion located in the second region such that the second part of the interconnect pattern is entirely covered with the adhesive, and electrically connecting the electrodes to the interconnect pattern; and (b) applying energy to the adhesive and hardening the adhesive.

* * * * *